(12) United States Patent
Kwon et al.

(10) Patent No.: US 8,314,365 B2
(45) Date of Patent: Nov. 20, 2012

(54) ELECTRONIC DEVICE HAVING CASE CAPABLE OF CONTROLLING COLORS AND METHOD OF CONTROLLING COLORS THEREOF

(75) Inventors: Ki Hwan Kwon, Seoul (KR); Seong Yun Kim, Suwon-si (KR); Jung Suk Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 423 days.

(21) Appl. No.: 12/655,396

(22) Filed: Dec. 30, 2009

(65) Prior Publication Data

US 2010/0163542 A1    Jul. 1, 2010

(30) Foreign Application Priority Data

Dec. 30, 2008    (KR) .................... 10-2008-0136416

(51) Int. Cl.
    H05B 3/02    (2006.01)

(52) U.S. Cl. .................... 219/209; 361/679.01; 215/263
(58) Field of Classification Search .................. 219/209;
                                                361/679.01; 215/263
See application file for complete search history.

(56) References Cited

FOREIGN PATENT DOCUMENTS

KR    1020050066217 A    6/2005
KR    1020050112612 A    12/2005

Primary Examiner — Long Pham

(57) ABSTRACT

An electronic device includes a case that is capable of controlling colors. The electronic device includes a case containing thermochromic pigments. The case includes a plurality of thermoelectric elements disposed at an internal surface. The case is coupled to a power source unit that supplies power to the plurality of thermoelectric elements and a temperature sensor that measuring a temperature of the plurality of thermoelectric elements. The electronic device includes an input unit for setting a color of the case and a controller for controlling power supply of the power source unit such that a temperature of the plurality of thermoelectric elements measured by the temperature sensor is included in a temperature range corresponding to a color input from the input unit.

9 Claims, 3 Drawing Sheets

ELECTRONIC DEVICE HAVING CASE CAPABLE OF CONTROLLING COLORS AND METHOD OF CONTROLLING COLORS THEREOF

CROSS-REFERENCE TO RELATED APPLICATION(S) AND CLAIM OF PRIORITY

The present application is related to and claims priority to an application entitled "ELECTRONIC DEVICE HAVING CASE CAPABLE OF CONTROLLING COLORS AND METHOD OF CONTROLLING COLORS THEREOF" filed in the Korean Intellectual Property Office on Dec. 30, 2008 and assigned Serial No. 10-2008-0136416, the contents of which are incorporated herein by reference.

TECHNICAL FIELD OF THE INVENTION

The present invention relates to an electronic device that includes a case capable of controlling colors and a method of controlling colors thereof, and more particularly, to an electronic device that includes a case capable of controlling colors and a method of controlling colors thereof that can change colors using a temperature control characteristic of a thermoelectric element and a color change characteristic according to a temperature of thermochromic pigment.

BACKGROUND OF THE INVENTION

Due to remarkable development of semiconductor integrated circuit technology, various electronic devices, such as a computer such as a desktop computer, laptop computer, and palmtop computer, a mobile terminal, Moving Picture Experts Group layer-3 (MP3), personal digital assistant (PDA), portable multimedia player (PMP), smart phone, digital camera, electronic scheduler, electronic dictionary, and electronic calculator, are now very widely used. Further, a user's request for such an electronic device becomes gradually various, and variety in a design or a color of an external appearance as well as a functional aspect of an electronic device is requested.

Particularly, in an external color of the electronic device, conventionally, a color of a case is limited to a color embodied in the case upon producing a product, or when a user wants to change a color of the case, it is necessary to buy and change a case of another color.

In a small-sized portable electronic device, for example, in a mobile communication terminal, in order to have various case colors, technology of providing an auxiliary cover of various colors to a portion of the case and of embodying an external appearance of another color by replacing the auxiliary cover is disclosed.

In this case, the user should directly replace an auxiliary cover, and there is a limitation to a color to be embodied as a case color, and a cost increases due to an auxiliary cover and it is inconvenient to store and maintain the auxiliary cover.

SUMMARY OF THE INVENTION

To address the above-discussed deficiencies of the prior art, it is a primary object to provide an electronic device that includes a case capable of controlling colors and a method of controlling colors thereof that can conveniently change a color of an external appearance of the electronic device through a temperature control without having a separate cover.

The present invention further provides an electronic device that includes a case capable of controlling colors and a method of controlling colors thereof that can prevent a color change of a case according to a temperature response color change of thermochromic pigments by measuring a temperature of a case at a predetermined period and controlling to maintain a temperature corresponding to a preset color.

In accordance with an aspect of the present invention, an electronic device including a case capable of controlling colors includes: a case including thermochromic pigments; a plurality of thermoelectric elements disposed at an internal surface of the case; a power source unit for supplying power to the plurality of thermoelectric elements; a temperature sensor configured to measure a temperature of the plurality of thermoelectric elements; an input unit configured to set a color of the case; and a controller configured to control power supply of the power source unit such that a temperature of the plurality of thermoelectric elements measured by the temperature sensor is included in a temperature range corresponding to a color input from the input unit.

Preferably, the case includes a case injection material and a pigment coating layer, and at least one thermochromic pigment is included in at least one of the case injection material and the pigment coating layer.

Preferably, the thermochromic pigment of the case is formed by mixing a plurality of thermochromic pigments.

Preferably, the plurality of thermoelectric elements include a peltier element.

In accordance with another aspect of the present invention, a method of controlling a color of a color case includes: setting a color of a thermochromic pigment case by an input unit; measuring, by a temperature sensor, a temperature of a plurality of thermoelectric elements disposed at an internal surface of the case; determining, by a controller, whether a measured temperature of a plurality of thermoelectric elements is included in a temperature range corresponding to a preset color; and controlling, by the controller, if a measured temperature of a plurality of thermoelectric elements is not included in a temperature range corresponding to a preset color, power supply of a power source unit such that a temperature of the plurality of thermoelectric elements is included in a temperature range.

Preferably, measuring, by a temperature sensor, a temperature of a plurality of thermoelectric elements disposed at an internal surface of the case, determining, by a controller, whether a measured temperature of a plurality of thermoelectric elements is included in a temperature range corresponding to a preset color, and controlling, by the controller, if a measured temperature of a plurality of thermoelectric elements is not included in a temperature range corresponding to a preset color, power supply of a power source unit such that a temperature of the plurality of thermoelectric elements is included in a temperature range is repeated at a predetermined period.

Preferably, controlling, by the controller, if a measured temperature of a plurality of thermoelectric elements is not included in a temperature range corresponding to a preset color, power supply of a power source unit such that a temperature of the plurality of thermoelectric elements is included in a temperature range includes changing polarity of a current supplied to the plurality of thermoelectric elements, or adjusting intensity of the current.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

Figure 1:
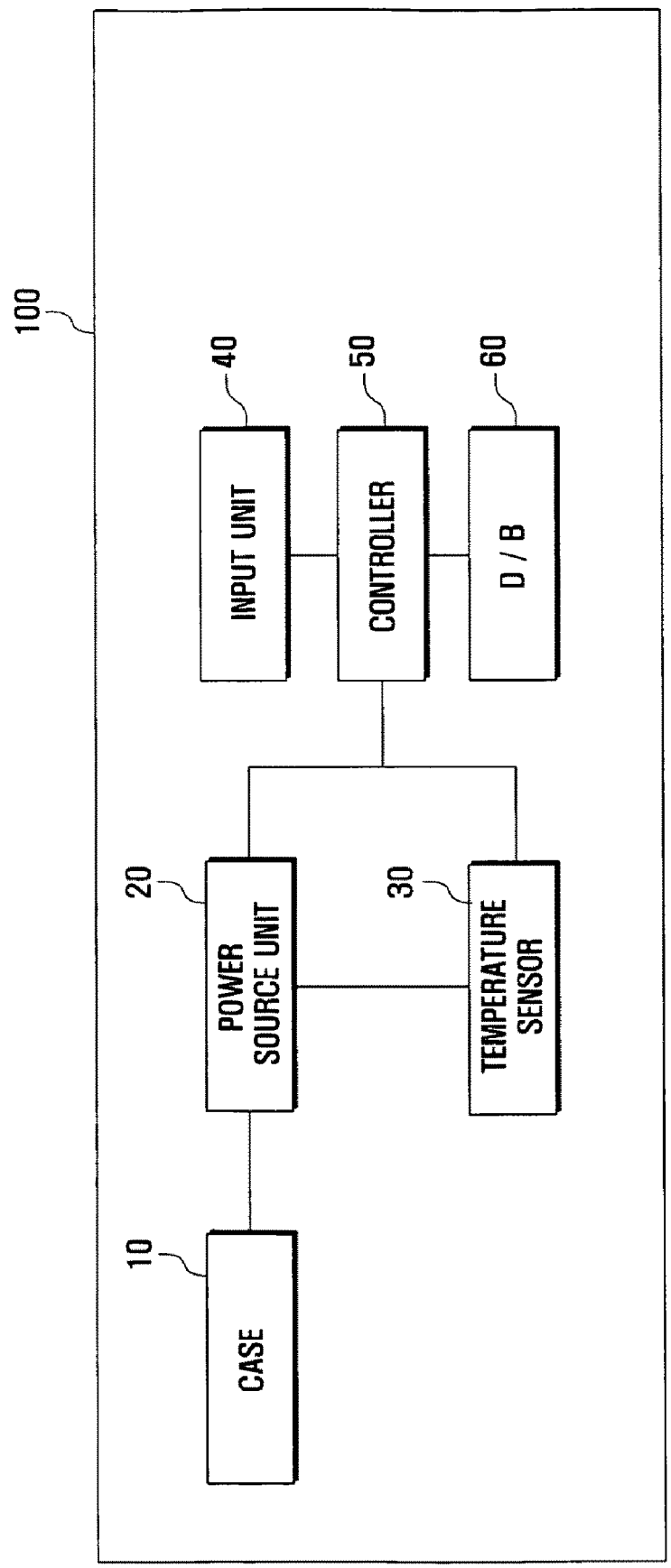
FIG. 1 illustrates a configuration of an electronic device having a case capable of controlling colors according to an exemplary embodiment of the present invention.
Figure 2:
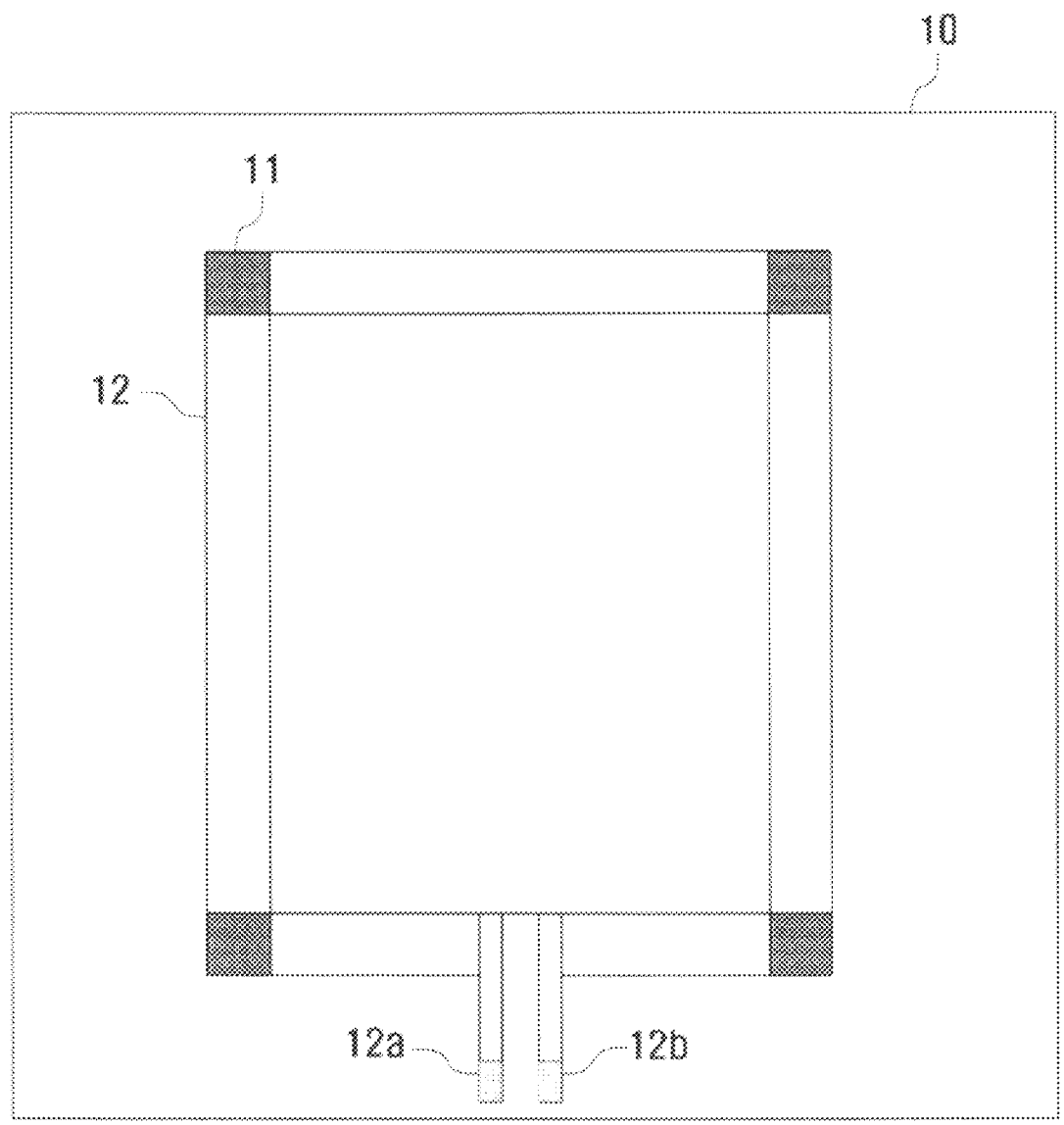
FIG. 2 illustrates a diagram of the case of FIG. 1.
Figure 3:
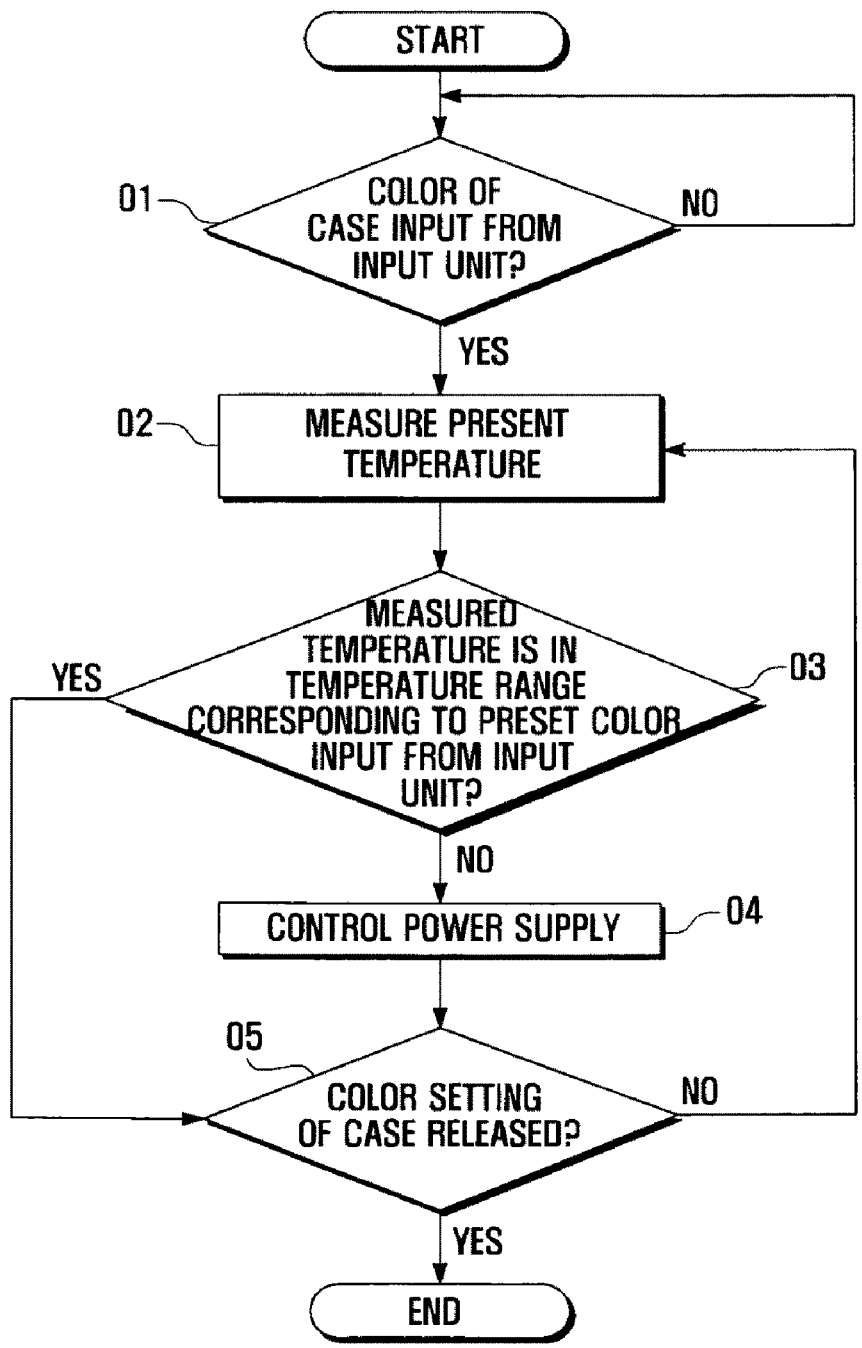
FIG. 3 illustrates a method of controlling colors of a case of an electronic device having the case capable of controlling colors according to another exemplary embodiment of the present invention.

FIGS. 1 through 3, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system.

FIG. 1 illustrates a configuration of an electronic device having a case capable of controlling colors according to an exemplary embodiment of the present invention.

Referring to FIG. 1, an electronic device 100 having a case capable of controlling colors according to the present exemplary embodiment includes a case 10, power source unit 20, temperature sensor 30, input unit 40, controller 50, and database 60.

The case 10 forms an external appearance of the electronic device 100. The case 10 can be formed with a resin injection material formed by injecting a resin into an injection molding of a thermoplastic plastic material and a pigment coating layer formed in a surface of the resin injection material, and thermochromic pigments are included in the resin injection material and/or the pigment coating layer. When the thermochromic pigments are included in the resin injection material, the case is formed by injecting a resin and thermochromic pigment with a predetermined ratio into the injection molding, and when the thermochromic pigment is included in the pigment coating layer, the case is formed by mixing the thermochromic pigment to a pigment composition and spraying the pigment composition in a resin injection material.

The thermochromic pigment is a pigment having a color changing according to a temperature, and a color of the thermochromic pigment starts to disappear according to increase of a temperature, and when a temperature comes down again, a color thereof returns to an original color. A color of the thermochromic pigment changes at a gap of 2 to 10 between −15° C. and 70° C., and various pigments such as pigment changing when a temperature increases by 2 from 20 and pigments each changing at 31° C., 43° C., and 65° C. exist. At 31° C. TP, which is a general thermochromic pigment, a color of the thermochromic pigment disappears at 33° C., and when a temperature thereof is lowered to an original temperature, a color thereof returns to an original color. Specifically, at blue thermochromic pigment (BT-20) changing at a temperature of 20° C., the BT-20 is shown with a blue color at a temperature of 20° C. or less. When a temperature of the BT-20 is 22° C., a color of the BT-20 disappears, at an orange thermochromic pigment (OT-31) changing at a temperature of 31° C., the OT-31 is shown with an orange color at a temperature of 31° C. When a heat is applied, a color of the OT-31 completely disappears at a temperature of 35° C.

At a red thermochromic pigment (RT-43) changing at a temperature of 43° C., the RT-43 is shown with a red color at a temperature of 43° C., and when a heat is applied, a color of the RT-43 disappears at a temperature of about 47° C.

Various colors of thermochromic pigments exist and, different colors may be obtained by mixing two thermochromic pigments or by mixing a thermochromic pigment and a general pigment, and another color may be obtained by mixing at least three thermochromic pigments having a temperature difference, and thermochromic pigments can be applied to a color request for various products according to development. For example, by mixing a thermochromic pigment of 20° C., thermochromic pigment of 31° C., and thermochromic pigment of 43° C., a color of the thermochromic pigment changes at a temperature of 25° C., a color of the thermochromic pigment changes at a temperature of 35° C., and the color of the thermochromic pigment can be changed to another color at a temperature of 45° C. or more.

However, the above thermochromic pigments are an illustration, and the present invention is not limited thereto, and the thermochromic pigment can appropriately be selected from multiple commercialized thermochromic pigments. Further, the thermochromic pigment can be selected from a temperature range of −15° C. to 70° C., however when the case 10 is used for an electronic device, a thermochromic pigment of a temperature range that does not influence on other constituent elements of an electronic device can be selected.

FIG. 2 illustrates a detailed diagram of the case 10 of FIG. 1.

Referring to FIG. 2, the case 10 includes a plurality of thermoelectric elements 11 disposed at the inside thereof and wirings 12 for connecting the plurality of thermoelectric elements 11. Contact points 12a and 12b for electrically connecting to the power source unit 20 are formed in an end portion of the wirings 12.

The thermoelectric element 11 is a semiconductor element that can perform cooling, heating, and temperature control by a current control and is disposed to control a temperature of the case 10, and a typical thermoelectric element is a peltier element. In the thermoelectric element 11, because a temperature difference occurs between both surfaces of the element by current supply, an endothermic reaction occurs at a low temperature side, and an exothermic reaction occurs at a high temperature side, and thus cooling phenomenon occurs at the low temperature side and heating phenomenon occurs at the high temperature side. Therefore, by changing polarity of a current supplied to the thermoelectric element 11, a flow direction of a heat is changed. Additionally, by changing intensity of a current, a heat amount is adjusted.

In FIG. 2, four thermoelectric elements 11 are disposed, however more thermoelectric elements can be disposed with predetermined arrangement according to a size of the case 10 and a temperature control range of a thermoelectric element. A plurality of thermoelectric elements 11 disposed in this way are connected by the wirings 12 and receive a current from the power source unit 20. The wirings 12 are connected to the power source unit 20 through the contact points 12a and 12b formed in the end portion.

The power source unit 20 supplies power to the plurality of thermoelectric elements 11, changes polarity of a current according to an instruction from the controller 50 and supplies the current, or adjusts intensity of a current and supplies the current. The temperature sensor 30 measures a temperature of the plurality of thermoelectric elements 11 based on a current supplied from the power source unit 20 to the plurality of thermoelectric element 11 and outputs the measured temperature to the controller 50.

The controller 50 controls a temperature of the plurality of thermoelectric elements 11. That is, if a color of the case 10 requested by a user is input from the input unit 40, a temperature range of the plurality of thermoelectric elements 11 is determined referring to a database 60 in which temperature range data according to colors of thermochromic pigment are stored. The controller 50 determines whether a present temperature of the plurality of thermoelectric elements 11 input from the temperature sensor 30 is included in the temperature range and sends, if a present temperature of the plurality of thermoelectric elements 11 input from the temperature sensor 30 is not included in the temperature range, an instruction of power supply to the power source unit 20. In this case, power supply by the power source unit 20 can change polarity of a current, or adjust intensity of a current.

FIG. 3 illustrates a method of controlling colors of a case 10 of an electronic device having the case 10 capable of controlling colors according to another exemplary embodiment of the present invention.

Referring to FIG. 3, when a color control starts, the controller 50 determines whether a color of the case 10 is input from the input unit 40 (step 02).

If a color of the case 10 is not input from the input unit 40, the process returns to step 01. If a color of the case 10 is input from the input unit 40, the controller 50 sends a temperature measurement instruction to the temperature sensor 30. The temperature sensor 30 measures a present temperature of a plurality of thermoelectric elements 11 in the power source unit 20 based on a current supplied to the case 10 (step 03).

When a present temperature of a plurality of thermoelectric elements 11 is input from the temperature sensor 30, the controller 50 determines whether a measured temperature is in a temperature range corresponding to a preset color input from the input unit 40 (step 04). In this case, the controller 50 determines a temperature range corresponding to a preset color referring to the database 60, having stored a temperature range according to a color of thermochromic pigment.

If a measured temperature is not in a temperature range corresponding to a preset color input from the input unit 40, the controller 50 controls power supply by instructing power supply to the power source unit 20 in order to overcome the difference between a measured temperature and a temperature range corresponding to a preset color (step 05). In this case, the controller 50 determines whether to change polarity of a current, or to adjust intensity of a current according to the difference between a measured temperature and a temperature range corresponding to a preset color.

If a measured temperature is in a temperature range corresponding to a preset color input from the input unit 40, it is unnecessary to control power supply by the power source unit 20 and thus step 05 is omitted and step 06 is performed.

The controller 50 determines whether color setting of the case 10 is released (step 06).

If color setting of the case 10 is released, a color control of the case 10 is terminated. If color setting of the case 10 is not released, the process returns to step 03.

In this way, until color setting is released, by repeating steps 03 to 06, a temperature of a plurality of thermoelectric elements 11 can be maintained in a temperature range corresponding to a preset color. This may be performed at a predetermined period, and thereby a color of thermochromic pigments included in the case 10 changes due to a temperature change of an external environment of an electronic device, thereby suppressing a change of a color of the case 10.

As described above, because an electronic device having a case capable of controlling colors according to the present invention controls a color of a case using a color change characteristic due to a temperature change of a thermochromic pigment and a temperature control characteristic of a thermoelectric element, a user can simply change a color of an external appearance of the case to a desired color without a separate case.

Further, by measuring a temperature of a case at a predetermined period and controlling a temperature within a temperature range corresponding to a preset color, the case can maintain a preset color.

The electronic device having a case capable of controlling colors according to the present invention may be one of various electronic devices, such as a desktop computer, laptop computer, audio device, digital versatile disk (DVD) device, and television as well as a portable or small-sized electronic device such as a mobile terminal, MP3, PDA, PMP, smart phone, wired/wireless phone, digital camera, electronic scheduler, electronic dictionary, electronic calculator, and palmtop computer.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An electronic device, the electronic device comprising a case capable of controlling colors, the case comprising:
   at least one thermochromic pigment; and
   a plurality of thermoelectric elements disposed at an internal surface of the case;
   a power source unit configured to supply power to the plurality of thermoelectric elements;
   a temperature sensor configured to measure a temperature of the plurality of thermoelectric elements;
   an input unit configured to set a color of the case; and
   a controller configured to control a power supply of the power source unit such that a temperature of the plurality of thermoelectric elements measured by the temperature sensor is included in a temperature range corresponding to a color input from the input unit.

2. The electronic device of claim 1, wherein the case comprises a case injection material and a pigment coating layer.

3. The electronic device of claim 2, wherein at least one thermochromic pigment is included in at least one of the case injection material and the pigment coating layer.

4. The electronic device of claim 1, wherein the at least one thermochromic pigments of the case comprises a plurality of different thermochromic pigments mixed together.

5. The electronic device of claim 4, wherein a first of the plurality of different thermochromic pigments is operable to emit a first color in a temperature range and a second of the plurality of different thermochromic pigment is operable to emit a second color in the temperature.

6. The electronic device of claim 1, wherein the plurality of thermoelectric elements comprise a peltier element.

7. A method of controlling a color of a color case, comprising:
   setting a color of a thermochromic pigment case by an input unit;
   measuring, by a temperature sensor, a temperature of a plurality of thermoelectric elements disposed at an internal surface of the case;
   determining, by a controller, whether a measured temperature of a plurality of thermoelectric elements is included in a temperature range corresponding to a preset color; and
   controlling, by the controller, if a measured temperature of a plurality of thermoelectric elements is not included in a temperature range corresponding to a preset color, a power supply of a power source unit such that a temperature of the plurality of thermoelectric elements is included in the temperature range.

8. The method of claim 7, wherein measuring, by a temperature sensor, a temperature of a plurality of thermoelectric elements disposed at an internal surface of the case, determining, by a controller, whether a measured temperature of a plurality of thermoelectric elements is included in a temperature range corresponding to a preset color, and controlling, by the controller, if a measured temperature of a plurality of thermoelectric elements is not included in a temperature range corresponding to a preset color, the power supply of a power source unit such that a temperature of the plurality of thermoelectric elements is included in the temperature range are repeated at a predetermined period.

9. The method of claim 8, wherein controlling, by the controller, a power supply of a power source unit such that a temperature of the plurality of thermoelectric elements is included in the temperature range comprises changing polarity of a current supplied to the plurality of thermoelectric elements, or adjusting intensity of the current.

* * * * *